(12) United States Patent
Cheng et al.

(10) Patent No.: US 8,410,487 B1
(45) Date of Patent: Apr. 2, 2013

(54) MANUFACTURING METHOD AND STRUCTURE OF LED CHIP

(75) Inventors: Wei-Tai Cheng, Zhudong Town (TW); Ming-Hung Chen, Zhudong Town (TW); Ching-Jen Pan, Zhudong Town (TW)

(73) Assignee: Helio Optoelectronics Corporation, Hsinchu County (TW)

( * ) Notice: Subject to any disclaimer, the term of this patent is extended or adjusted under 35 U.S.C. 154(b) by 0 days.

(21) Appl. No.: 13/326,528

(22) Filed: Dec. 15, 2011

(30) Foreign Application Priority Data

Nov. 2, 2011 (TW) .............................. 100140026 A

(51) Int. Cl.
*H01L 29/15* (2006.01)
(52) U.S. Cl. ............... 257/76; 257/79; 257/82; 257/88; 257/93; 257/98; 438/22; 438/23; 438/26; 438/34; 438/38

(58) Field of Classification Search ................... None
See application file for complete search history.

(56) References Cited

U.S. PATENT DOCUMENTS 5,321,294 A * 6/1994 Chino et al. .................... 257/85

* cited by examiner

*Primary Examiner* — Kyoung Lee
(74) *Attorney, Agent, or Firm* — Stites & Harbison, PLLC; Juan Carlos A. Marquez, Esq

(57) ABSTRACT

A manufacturing method and a structure of a light-emitting diode (LED) chip are disclosed. The method includes the steps of: providing a conductive block; providing an epitaxial block; bonding; removing an epitaxial substrate; making independent LEDs; forming a dielectric layer; and making electrical connection. A first LED, a second LED, and a third LED are formed on the conductive block, wherein the first and second LEDs are electrically connected in series, and the second and third LEDs are electrically connected in parallel. Thus, a basic unit with a flexible design of series- and parallel-connected LEDs can be formed to increase the variety and application of LED chip-based designs.

12 Claims, 9 Drawing Sheets

MANUFACTURING METHOD AND STRUCTURE OF LED CHIP

BACKGROUND OF THE INVENTION

1. Technical Field

The present invention relates to a method for making a light-emitting diode (LED) chip and the structure of the LED chip. More particularly, the present invention relates to a manufacturing method and a structure of an LED chip configured for illumination purposes.

2. Description of Related Art

Please refer to FIG. 1 for a sectional view of a conventional horizontal-structure LED unit 101 with parallel-connected LEDs. Manufacture of the LED unit 101 begins by forming an n-type semiconductor layer 111 on a gallium arsenide (GaAs) dielectric substrate 10, and a p-type semiconductor layer 112 on the n-type semiconductor layer 111. Then, an etching process is carried out to form a plurality of LEDs 11, which are subsequently connected in parallel by a first dielectric material 12 and a conductive layer 13. The LEDs 11 made by the TD process can only form a parallel-connected structure but cannot form a series-connected structure.

FIG. 2 is a sectional view of a conventional horizontal-structure LED unit 102 with parallel-connected LEDs made by the wafer bonding (WB) process. To make the LED unit 102 by the WB process, a second dielectric material 15 is formed on a metal or silicon substrate 14, then a p-type semiconductor layer 112 is formed on the second dielectric material 15, and an n-type semiconductor layer 111 is formed on the p-type semiconductor layer 112. Afterward, a plurality of LEDs 11 is formed by etching, and the LEDs 11 are connected in parallel by a first dielectric material 12 and a conductive layer 13. Again, the vertical LEDs 11 made by the WB process can form a parallel-connected structure but not a series-connected structure.

FIG. 3 is a sectional view of a conventional horizontal-structure LED unit 103 with series-connected LEDs made by the WB process. The WB-based manufacturing process includes forming a second dielectric material 15 on a metal or silicon substrate 14, forming a p-type semiconductor layer 112 on the second dielectric material 15, forming an n-type semiconductor layer 111 on the p-type semiconductor layer 112, forming a plurality of LEDs 11 by etching, and connecting the LEDs 11 in series by a first dielectric material 12 and a conductive layer 13.

According to the above, the conventional horizontal-structure LED unit 101 can only form a structure with parallel-connected LEDs (hereinafter referred to as a parallel-connected LED structure). Likewise, the conventional horizontal-structure LED units 102, 103 made by the WB process can only form either a parallel-connected LED structure or a structure with series-connected LEDs (hereinafter referred to as a series-connected LED structure); it is practically impossible to form a structure with series- and parallel-connected LEDs (hereinafter referred to as a series- and parallel-connected LED structure) in a single manufacturing process. As such, the conventional techniques leave much to be desired.

BRIEF SUMMARY OF THE INVENTION

The present invention relates to a manufacturing method and a structure of an LED chip, wherein at least one series- and parallel-connected LED structure is formed on a substrate using a wafer-level manufacturing process. By implementing the present invention, the variety and application of LED chip-based designs can be significantly increased.

The present invention provides a manufacturing method of a light-emitting diode (LED) chip, comprising the steps of: providing a conductive block, wherein the conductive block comprises: a conductive substrate having a first region and a second region; a first dielectric layer formed on the first region; and a first metal layer formed on the second region and the first dielectric layer; providing an epitaxial block, wherein the epitaxial block comprises: an epitaxial substrate; an epitaxial layer formed on the epitaxial substrate; and a second metal layer formed on a semiconductor side of the epitaxial layer; bonding, wherein the first metal layer is bonded with the second metal layer so that the conductive block and the epitaxial block are bonded together to form a bonded block; removing the epitaxial substrate, wherein the epitaxial substrate is removed from the bonded block so as to form an LED block; making independent LEDs, wherein the LED block is etched so that at least a first LED is formed on the first region and at least a second LED and at least a third LED are formed on the second region; forming a second dielectric layer, wherein the second dielectric layer is formed between the at least a first LED, the at least a second LED, and the at least a third LED; and making electrical connection, wherein a first conductive layer is formed on the second dielectric layer to series-connect each said first LED and each said second LED, and a second conductive layer is formed on the second dielectric layer to parallel-connect each said second LED and each said third LED.

The present invention also provides A light-emitting diode (LED) chip structure, comprising: a conductive block comprising: a conductive substrate having a first region and a second region; a first dielectric layer formed on the first region; and a plurality of first metal layers independently connected to the second region and the first dielectric layer; at least a first LED fixedly provided on the first dielectric layer via bonding between one of a plurality of second metal layers and a said first metal layer; at least a second LED fixedly provided on the second region via bonding between a said second metal layer and a said first metal layer, wherein the at least a second LED is connected in series to the at least a first LED by one of a plurality of second dielectric layers and a first conductive layer; and at least a third LED fixedly provided on the second region via bonding between a said second metal layer and a said first metal layer, wherein the at least a third LED is connected in parallel to the at least a second LED by a said second dielectric layer and a second conductive layer.

Implementation of the present invention at least involves the following inventive steps:

1. A series- and parallel-connected LED structure can be formed on a conductive block by a simple manufacturing process.

2. The variety and application of LED chip-based designs can be substantially increased.

The detailed features and advantages of the present invention will be described in detail with reference to the preferred embodiments so as to enable persons skilled in the art to gain insight into the technical disclosure of the present invention, implement the present invention accordingly, and readily understand the objectives and advantages of the present invention by perusal of the contents disclosed in the specification, the claims, and the accompanying drawings.

DETAILED DESCRIPTION OF THE INVENTION

Figure 1:
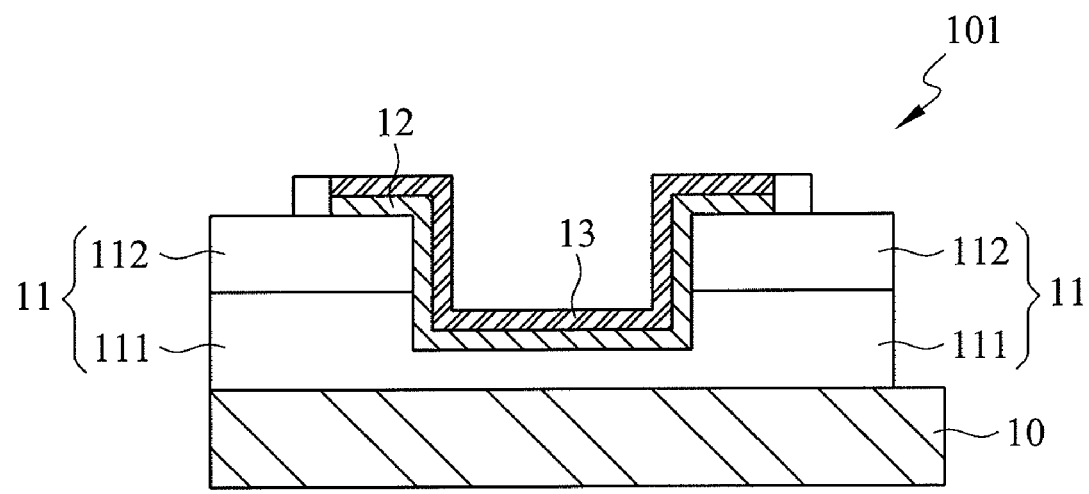
FIG. 1 is a sectional view of a conventional horizontal-structure LED unit.
Figure 2:
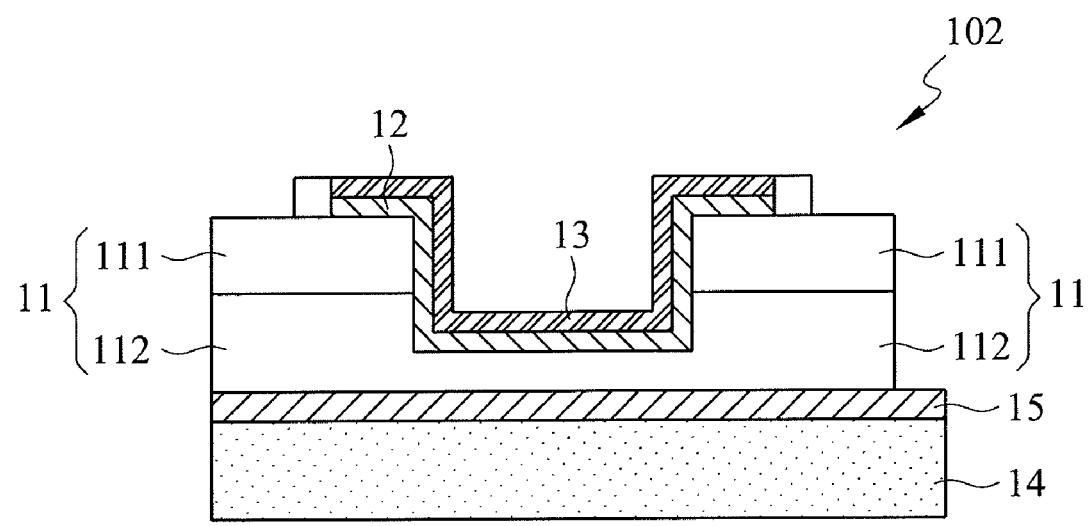
FIG. 2 is a sectional view of a conventional horizontal-structure LED unit made by the WB process.
Figure 3:
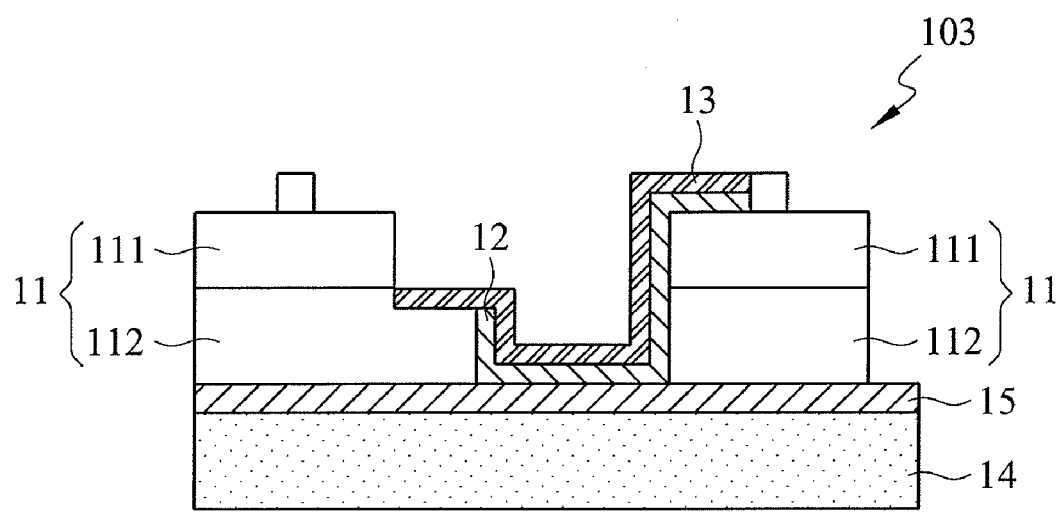
FIG. 3 is a sectional view of a conventional series-connected LED unit made by the WB process.
Figure 4:
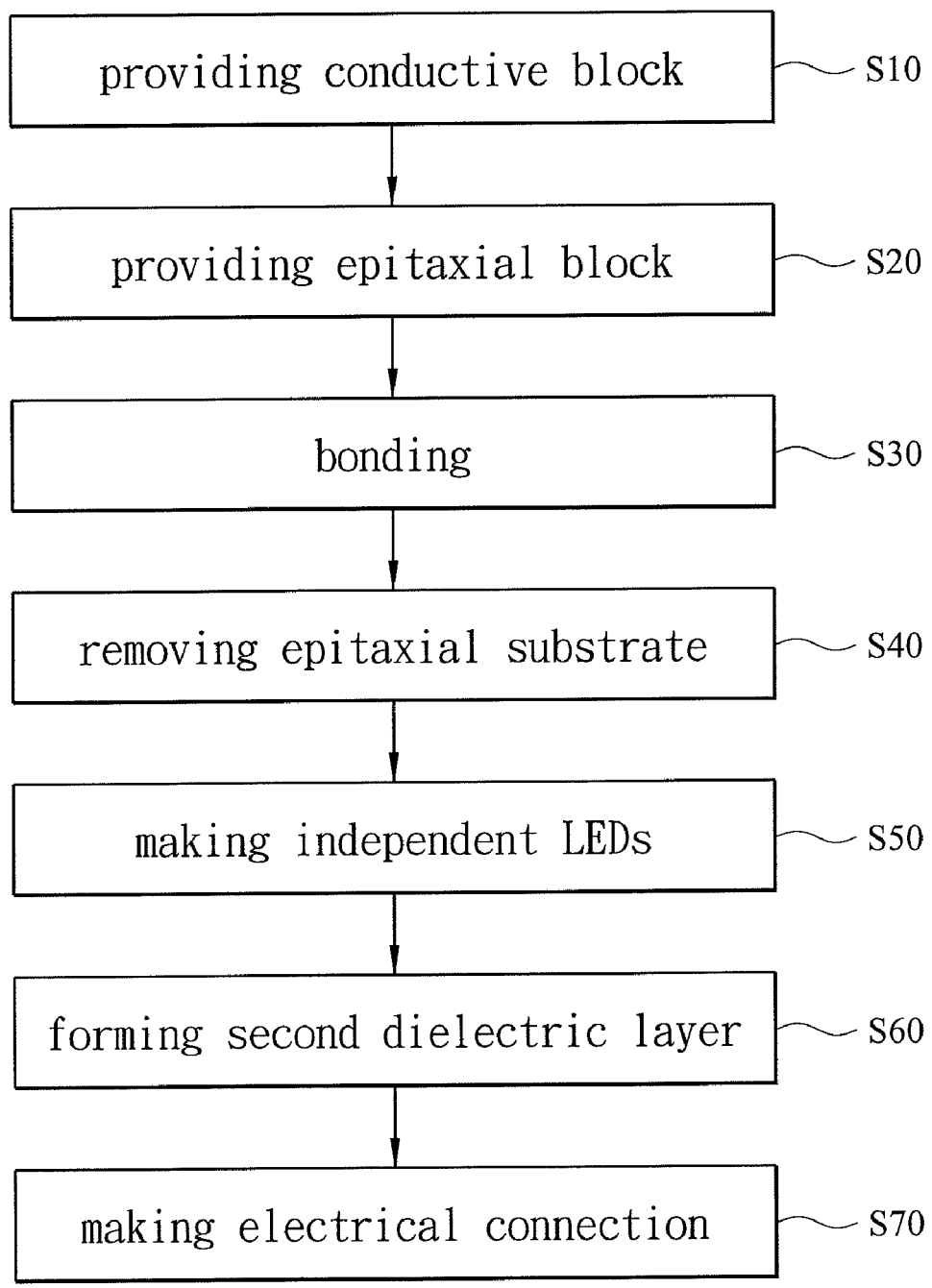
FIG. 4 is the flowchart of a method for making an LED chip according to an embodiment of the present invention.

Please refer to FIG. 4 for the flowchart of a method 5200 for making an LED chip according to an embodiment of the present invention. The method includes the steps of: providing a conductive block (step S10), providing an epitaxial block (step S20), bonding (step S30), removing an epitaxial substrate (step S40); making independent LEDs (step S50), forming a second dielectric layer (step S60), and making electrical connection (step S70).

Figure 5A:
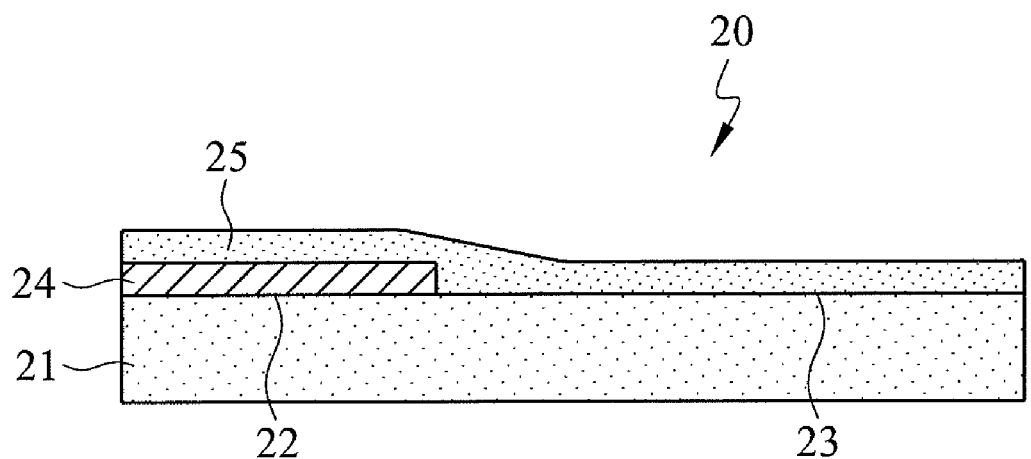
FIG. 5A is a sectional view showing the first aspect of a conductive block in the present invention.

The step of providing a conductive block (step S10) is detailed as follows. Referring to FIG. 5A, a conductive block 20 is provided which includes a conductive substrate 21. In order to form horizontal-structure LEDs and vertical-structure LEDs at the same time, the conductive substrate 21 is divided into a first region 22 and a second region 23. A first dielectric layer 24 is formed on the first region 22 to provide the conditions for making horizontal-structure LEDs in a later step. Then, a first metal layer 25 is formed on both the second region 23 and the first dielectric layer 24 to enable the subsequent bonding step. Not only that, the first metal layer 25 on the second region 23 provides the conditions for making vertical-structure LEDs.

Figure 5B:
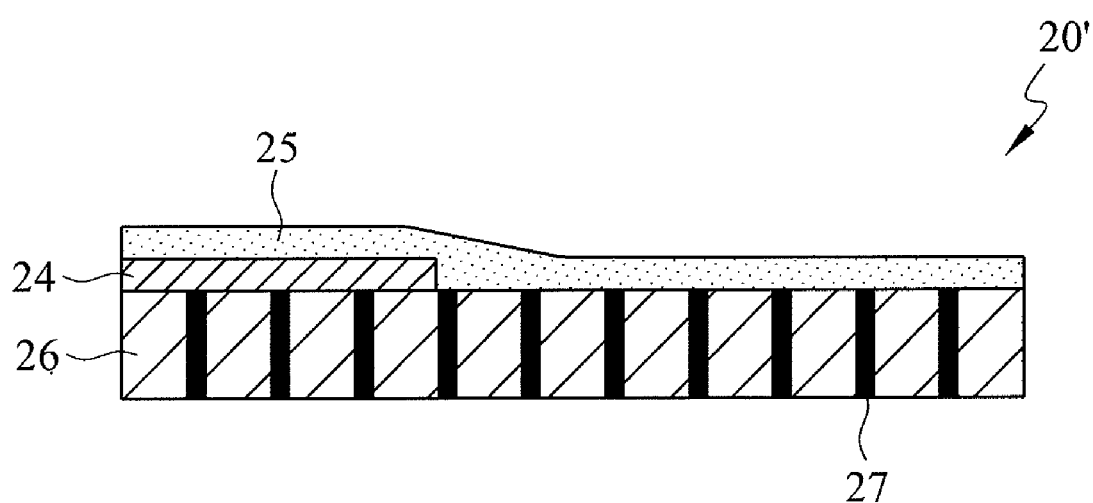
FIG. 5B is a sectional view showing the second aspect of the conductive block in the present invention.

Referring to FIG. 5B, the conductive substrate 21 can be a semiconductor wafer substrate, such as a semiconductor conductive substrate made of a group IV-IV, group III-IV, group II-VI, silicon, germanium, gallium nitride, or gallium arsenide. Alternatively, the conductive substrate 21 can be a substrate with high conductivity, such as one made of copper tungsten, molybdenum, copper, tungsten, or manganese. The conductive substrate 21 can also be made by processing a non-conductive substrate such that the non-conductive substrate is rendered conductive. For instance, the conductive substrate 21 includes a non-conductive substrate 26, and the non-conductive substrate 26 is provided therein with a plurality of first conductive posts 27. Each first conductive post 27 penetrates and extends through the non-conductive substrate 26 and is electrically connected to the first metal layer 25. The first conductive posts 27 also provide heat dissipation.

Figure 6:
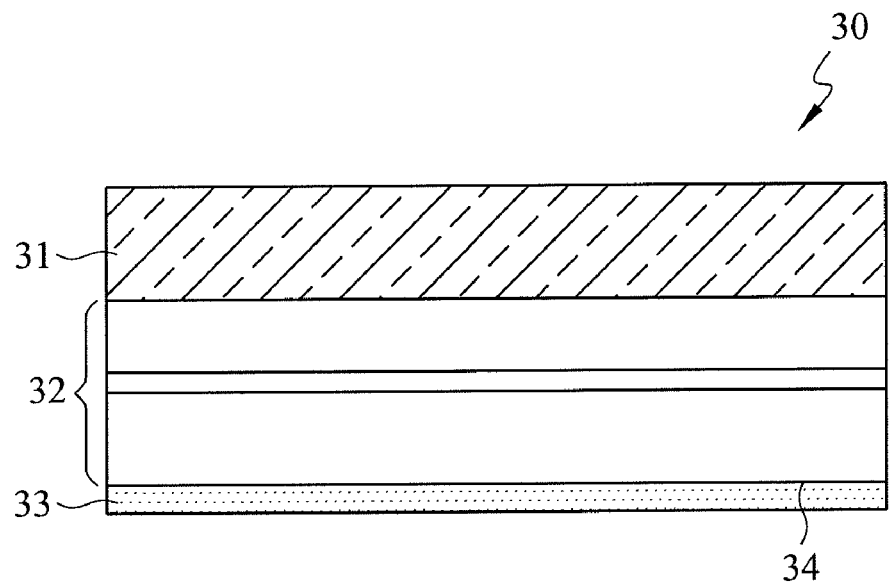
FIG. 6 is a sectional view of an epitaxial block according to an embodiment of the present invention.

The step of providing an epitaxial block (step S20) is now described with reference to FIG. 6. An epitaxial block 30 is provided in the form of an LED epitaxial block and includes an epitaxial substrate 31, an epitaxial layer 32, and a second metal layer 33. The epitaxial substrate 31 serves to grow and support LEDs. The epitaxial layer 32 constitutes the LEDs and is formed on the epitaxial substrate 31. The second metal layer 33 is formed on a semiconductor side 34 of the epitaxial layer 32 (i.e., the side of the epitaxial layer 32 that is opposite the epitaxial substrate 31) to facilitate subsequent bonding.

Figure 7:
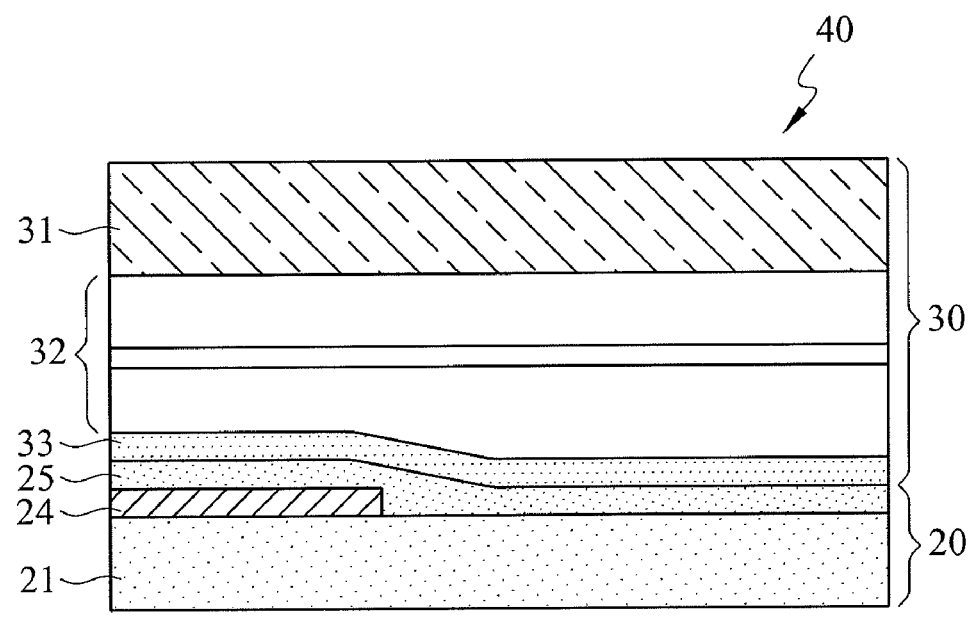
FIG. 7 is a sectional view of a bonded block according to an embodiment of the present invention.

Referring to FIG. 7, the step of bonding (step S30) is carried out in the following manner. With the first metal layer 25 on the conductive block 20 and the second metal layer 33 on the epitaxial block 30, the conductive block 20 and the epitaxial block 30 are bonded together by bonding the first metal layer 25 with the second metal layer 33. This can be easily done thanks to the same material properties of the first and second metal layers 25, 33. After bonding, the conductive block 20 and the epitaxial block 30 jointly form a bonded block 40.

Figure 8:
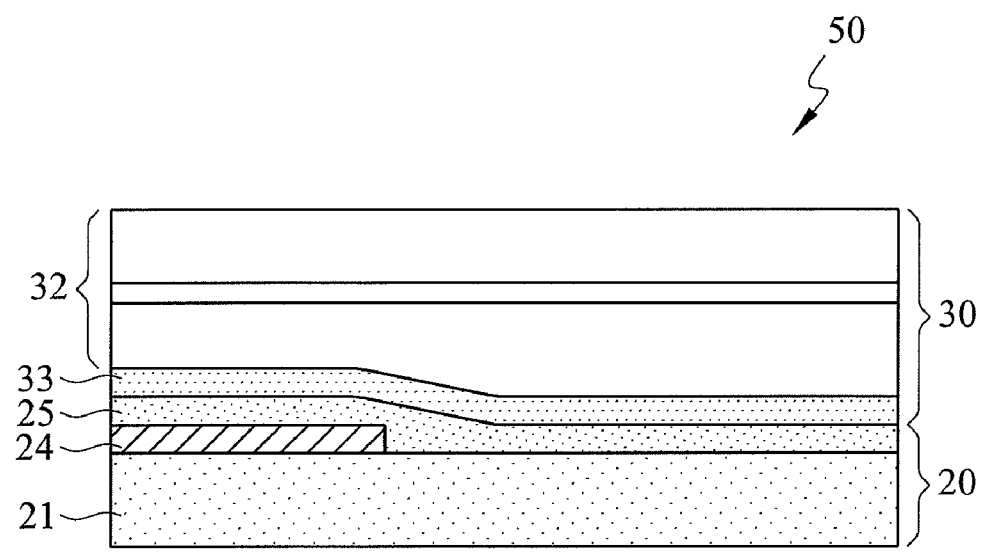
FIG. 8 is a sectional view of an LED block according to an embodiment of the present invention, wherein the LED block is formed by removing an epitaxial substrate from the bonded block.

Next, the step of removing the epitaxial substrate (step S40) is performed. Referring to FIG. 8, once the conductive block 20 and the epitaxial block 30 form the bonded block 40, the conductive block 20 replaces the epitaxial substrate 31 as the structural support for the epitaxial layer 32. In order for subsequently formed LEDs to emit light effectively, the epitaxial substrate 31 must be removed from the bonded block 40. The removal of the epitaxial substrate 31 also facilitates the manufacture of each LED in the following step. By transferring the epitaxial layer 32 to the conductive block 20 and removing the epitaxial substrate 31, the bonded block 40 is turned into an LED block 50.

Figure 9:
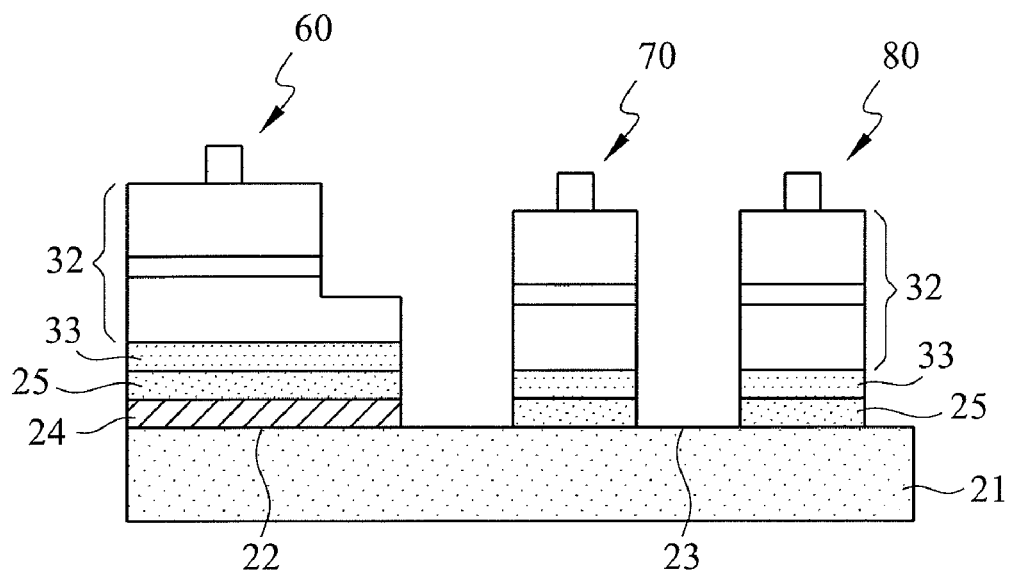
FIG. 9 is a sectional view of a plurality of independent LEDs according to an embodiment of the present invention, wherein the LEDs are formed by etching.

Then, the step of making independent LEDs (step S50) is executed. Referring to FIG. 9, an etching process is performed on the LED block 50 formed in the previous step. In order to make a series- and parallel-connected LED structure, the LED block 50 must, to begin with, be etched to form a plurality of independent LEDs. The etching process is conducted no further than the first dielectric layer 24. As a result, the first metal layer 25 is divided into several independent sections that are electrically disconnected.

The etching process is planned as follows. Since the first dielectric layer 24 on the first region 22 provides the conditions for making horizontal structures, at least one first LED 60 must be formed on the first region 22. On the other hand, now that the first metal layer 25 and the second metal layer 33 on the second region 23 are electrically connected with the conductive substrate 21 and therefore provide the conditions for making vertical structures, a parallel-connected structure including at least one second LED 70 and at least one third LED 80 must be formed on the second region 23. The at least one first LED 60 will be later connected in series to the parallel-connected second and third LEDs 70, 80, as explained further below.

Figure 10:
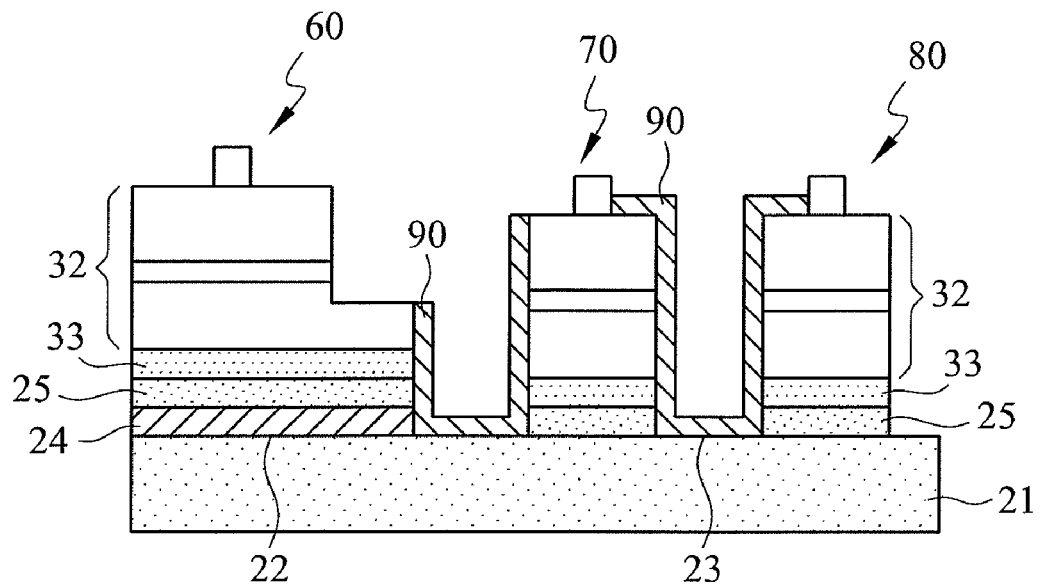
FIG. 10 is a sectional view showing how a second dielectric layer is formed on the independent LEDs according to an embodiment of the present invention.

The step of forming a second dielectric layer (step S60) is now described with reference to FIG. 10. After the making of the independent LEDs (step S50), a second dielectric layer 90 is formed in the etched-away portions between the first, second, and third LEDs 60, 70, 80 to provide the necessary electrical isolation for forming a series and parallel circuit in the subsequent step.

Figure 11A:
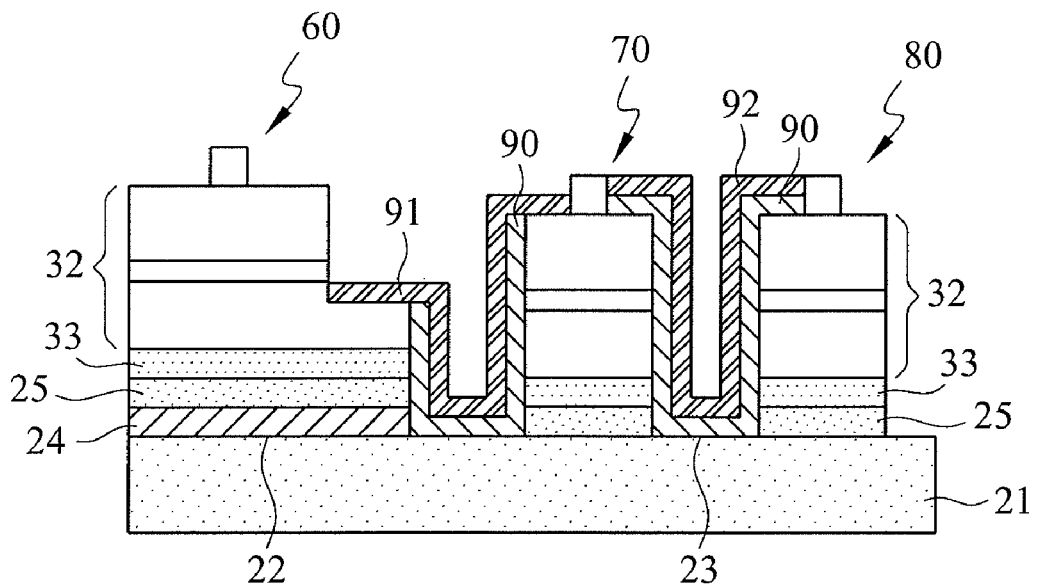
FIG. 11A is a sectional view showing the first aspect of using a conductive layer on the second dielectric layer to make series and parallel electrical connection according to the present invention.
Figure 11B:
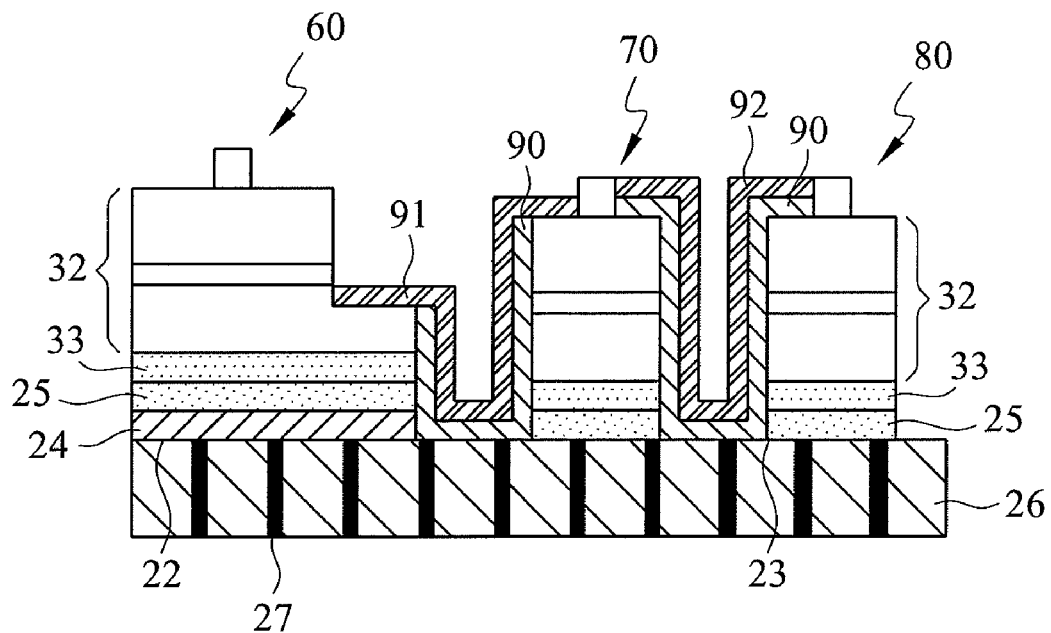
FIG. 11B is a sectional view showing the second aspect of using a conductive layer on the second dielectric layer to make series and parallel electrical connection according to the present invention.

Lastly, the step of making electrical connection (step S70) is performed, as shown in FIGS. 11A and 11B. A first conductive layer 91 is formed on the second dielectric layer 90 to connect each first LED 60 and each second LED 70 in series. Additionally, a second conductive layer 92 is formed on the second dielectric layer 90 to connect each second LED 70 and each third LED 80 in parallel. Thus, an LED circuit with both series and parallel connections is formed on the conductive block 20.

Figure 12:
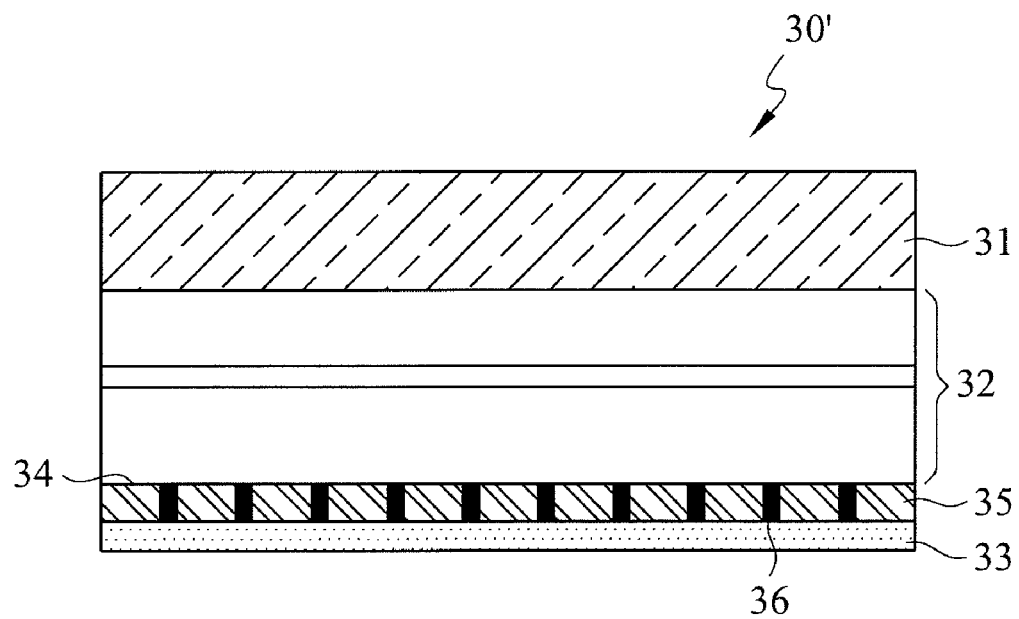
FIG. 12 is a sectional view of an epitaxial block according to another embodiment of the present invention, wherein the epitaxial block has a reflective layer.

Referring to FIG. 12, with a view to increasing light emitting efficiency of the LEDs, the epitaxial block 30' is made in such a way that a reflective layer 35 is formed between the semiconductor side 34 of the epitaxial layer 32 and the second metal layer 33. Reflection of the reflective layer 35 can enhance light emitting efficiency of the LEDs. The reflective layer 35 is generally made of a dielectric material. However, as the second and third LEDs 70, 80 must be vertical structures, the semiconductor side 34 of at least the second and third LEDs 70, 80 must be electrically connected to the second metal layer 33. To achieve this end, at least a portion of the reflective layer 35 that corresponds in position to the second and third LEDs 70, 80 is formed therein with a plurality of second conductive posts 36 for making electrical connection between the semiconductor side 34 of the second and third LEDs 70, 80 and the second metal layer 33. The second conductive posts 36 also serve to dissipate heat.

In order not to complicate the manufacturing process with an additional alignment step, the plural second conductive posts 36 need not be formed only in a portion of the reflective layer 35 that corresponds in position to the first region 22 or the second region 23. In other words, the second conductive posts 36 can be distributed over a wider area than required to electrically connect the semiconductor side 34 of the first, second, and third LEDs 60, 70, 80 to the second metal layer 33. As the portion of the second metal layer 33 that corresponds in position to the at least one first LED 60 has been divided into separate and electrically disconnected sections after the etching process, the aforesaid arrangement of the second conductive posts 36 has no adverse effect on the manufacture of the intended series circuit.

Referring again to FIG. 11A, the present invention also provides an embodiment of an LED chip structure 200 based on the foregoing manufacturing method. In the embodiment shown in FIG. 11A, the LED chip structure 200 includes a conductive block 20, at least one first LED 60, at least one second LED 70, and at least one third LED 80.

The conductive block 20 includes a conductive substrate 21, which has a first region 22 and a second region 23. The first region 22 is covered by a first dielectric layer 24. The second region 23 and the first dielectric layer 24 are covered by a plurality of separate first metal layers 25. The first metal layers 25 form independent and electrically disconnected sections as a result of etching and serve a bonding function during the manufacturing process.

The conductive substrate 21 can be a semiconductor wafer substrate, such as a semiconductor conductive substrate made of a group IV-IV, group III-IV, group II-VI, silicon, germanium, gallium nitride, or gallium arsenide. Alternatively, the conductive substrate 21 can be a substrate with high conductivity, such as one made of copper tungsten, molybdenum, copper, tungsten, or manganese.

The conductive substrate 21 can also be made by processing a non-conductive substrate and thus providing the non-conductive substrate with electrical conductivity. For example, referring to FIG. 11B, the conductive substrate includes a non-conductive substrate 26, and the non-conductive substrate 26 is formed therein with a plurality of first conductive posts 27. Each first conductive post 27 penetrates and extends through the non-conductive substrate 26 and is electrically connected to the corresponding first metal layer 25. The first conductive posts 27 also provide heat dissipation.

The first LED 60 is fixed to the first dielectric layer 24 on the first region 22 via bonding between one of a plurality of second metal layers 33 and one of the first metal layers 25.

Similarly, the second LED 70 is fixedly provided on the second region 23 via bonding between one of the second metal layers 33 and one of the first metal layers 25. In addition, the second LED 70 and the first LED 60 are connected in series by one of a plurality of second dielectric layers 90 and a first conductive layer 91.

The third LED 80 is fixed on the second region 23 via bonding between another pair of the first and second metal layers 25, 33. Furthermore, the third LED 80 and the second LED 70 are connected in parallel by one of the second dielectric layers 90 and a second conductive layer 92.

Figure 13:
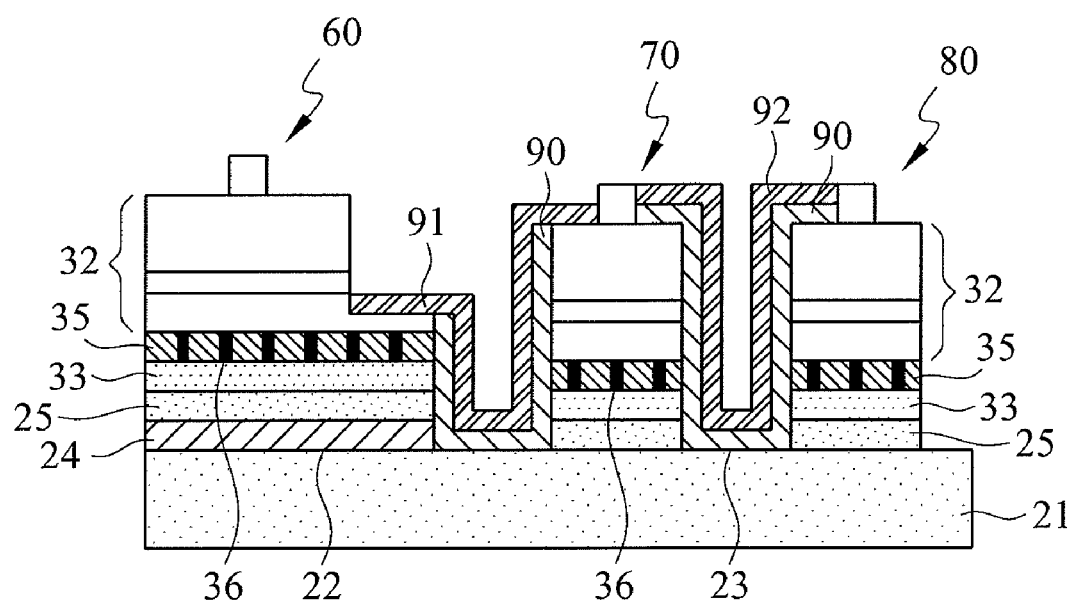
FIG. 13 is a sectional view of an LED chip structure according to an embodiment of the present invention, wherein the LED chip structure has a non-conductive substrate with a plurality of first conductive posts.

As shown in FIG. 13, in order to enhance light emitting efficiency of the LEDs, a reflective layer 35 is provided between each of the first, second, and third LEDs 60, 70, 80 and the corresponding second metal layer 33. Now that the second LED 70 and the third LED 80 are intended to be vertical structures, at least the reflective layers 35 on the second region 23 must be provided therein with a plurality of second conductive posts 36, so as for the second LED 70 and the third LED 80 to be respectively and electrically connected to the corresponding second metal layers 33. The second conductive posts 36 serve a heat dissipating function as well.

With the LED chip structure 200 being a product of the foregoing method S200 for making an LED chip, further details of the LED chip structure 200 as can be known from the description of the method S200 are not repeated herein.

The features of the present invention are disclosed above by the preferred embodiments to allow persons skilled in the art to gain insight into the contents of the present invention and implement the present invention accordingly. The preferred embodiments of the present invention should not be interpreted as restrictive of the scope of the present invention. Hence, all equivalent modifications or amendments made to the aforesaid embodiments should fall within the scope of the appended claims.

What is claimed is:

1. A manufacturing method of a light-emitting diode (LED) chip, comprising the steps of:

providing a conductive block, wherein the conductive block comprises: a conductive substrate having a first region and a second region; a first dielectric layer formed on the first region; and a first metal layer formed on the second region and the first dielectric layer;

providing an epitaxial block, wherein the epitaxial block comprises: an epitaxial substrate; an epitaxial layer formed on the epitaxial substrate; and a second metal layer formed on a semiconductor side of the epitaxial layer;

bonding, wherein the first metal layer is bonded with the second metal layer so that the conductive block and the epitaxial block are bonded together to form a bonded block;

removing the epitaxial substrate, wherein the epitaxial substrate is removed from the bonded block so as to form an LED block;

making independent LEDs, wherein the LED block is etched so that at least a first LED is formed on the first region and at least a second LED and at least a third LED are formed on the second region;

forming a second dielectric layer, wherein the second dielectric layer is formed between the at least a first LED, the at least a second LED, and the at least a third LED; and making electrical connection, wherein a first conductive layer is formed on the second dielectric layer to series-connect each said first LED and each said second LED, and a second conductive layer is formed on the second dielectric layer to parallel-connect each said second LED and each said third LED.

2. The manufacturing method of claim 1, wherein the conductive substrate is a semiconductor wafer substrate.

3. The manufacturing method of claim 2, wherein the semiconductor wafer substrate is a semiconductor conductive substrate made of a group IV-IV, group III-IV, group II-VI, silicon, germanium, gallium nitride, or gallium arsenide.

4. The manufacturing method of claim 1, wherein the conductive substrate is made of copper tungsten, molybdenum, copper, tungsten, or manganese.

5. The manufacturing method of claim 1, wherein the conductive substrate comprises: a non-conductive substrate and a plurality of first conductive posts extending through the non-conductive substrate and electrically connected to the first metal layer.

6. The manufacturing method of claim 1, wherein a reflective layer is formed between the semiconductor side and the second metal layer, and the reflective layer is provided therein with a plurality of second conductive posts for electrically connecting the semiconductor side and the second metal layer.

7. A light-emitting diode (LED) chip structure, comprising:
   a conductive block comprising: a conductive substrate having a first region and a second region; a first dielectric layer formed on the first region; and a plurality of first metal layers independently connected to the second region and the first dielectric layer;
   at least a first LED fixedly provided on the first dielectric layer via bonding between one of a plurality of second metal layers and a said first metal layer;
   at least a second LED fixedly provided on the second region via bonding between a said second metal layer and a said first metal layer, wherein the at least a second LED is connected in series to the at least a first LED by one of a plurality of second dielectric layers and a first conductive layer; and
   at least a third LED fixedly provided on the second region via bonding between a said second metal layer and a said first metal layer, wherein the at least a third LED is connected in parallel to the at least a second LED by a said second dielectric layer and a second conductive layer.

8. The LED chip structure of claim 7, wherein the conductive substrate is a semiconductor wafer substrate.

9. The LED chip structure of claim 8, wherein the semiconductor wafer substrate is a semiconductor conductive substrate made of a group IV-IV, group III-IV, group II-VI, silicon, germanium, gallium nitride, or gallium arsenide.

10. The LED chip structure of claim 7, wherein the conductive substrate is made of copper tungsten, molybdenum, copper, tungsten, or manganese.

11. The LED chip structure of claim 7, wherein the conductive substrate comprises:
   a non-conductive substrate and a plurality of first conductive posts extending through the non-conductive substrate and electrically connected to said first metal layers on the second region.

12. The LED chip structure of claim 7, further comprising a reflective layer between each said first LED and a corresponding said second metal layer, each said second LED and a corresponding said second metal layer, and each said third LED and a corresponding said second metal layer, wherein each said reflective layer on the second region is provided therein with a plurality of second conductive posts so that each said second LED is electrically connected to a corresponding said second metal layer and each said third LED is electrically connected to a corresponding said second metal layer.

* * * * *